(12) United States Patent
Arreghini

(10) Patent No.: US 11,387,248 B2
(45) Date of Patent: Jul. 12, 2022

(54) THREE-DIMENSIONAL SEMICONDUCTOR DEVICE HAVING VERTICAL CHANNEL EXTENDING THROUGH HORIZONTAL LAYER STRUCTURE AND METHOD OF FABRICATING SAME

(71) Applicant: IMEC vzw, Leuven (BE)

(72) Inventor: Antonio Arreghini, Kessel-Lo (BE)

(73) Assignee: IMEC vzw, Leuven (BE)

( * ) Notice: Subject to any disclaimer, the term of this patent is extended or adjusted under 35 U.S.C. 154(b) by 110 days.

(21) Appl. No.: 16/218,271

(22) Filed: Dec. 12, 2018

(65) Prior Publication Data

US 2019/0198525 A1 Jun. 27, 2019

(30) Foreign Application Priority Data

Dec. 22, 2017 (EP) .................................. 17210366

(51) Int. Cl.
*H01L 27/11582* (2017.01)
*H01L 27/11556* (2017.01)
(Continued)

(52) U.S. Cl.
CPC .. *H01L 27/11582* (2013.01); *H01L 21/76865* (2013.01); *H01L 21/76877* (2013.01);
(Continued)

(58) Field of Classification Search
CPC ......... H01L 27/11582; H01L 27/11556; H01L 27/11524; H01L 27/1157; H01L 27/1159;
(Continued)

(56) References Cited

U.S. PATENT DOCUMENTS 9,443,865 B2 9/2016 Rabkin et al.
9,515,080 B2 12/2016 Takahashi et al.
(Continued)

FOREIGN PATENT DOCUMENTS

WO WO 2016/028621 A1 2/2016

OTHER PUBLICATIONS

Arreghini et al., "First demonstration of SiGe channel in Macaroni geometry for future 3D Nand", In Memory Workshop (IMW), 2017 IEEE International, in 4 pages.
(Continued)

*Primary Examiner* — Sophia T Nguyen
*Assistant Examiner* — Scott E Bauman
(74) *Attorney, Agent, or Firm* — Knobbe, Martens, Olson & Bear, LLP

(57) ABSTRACT

The disclosed technology generally relates to semiconductor devices, and more particularly to three-dimensional semiconductor devices. In one aspect, a method of manufacturing a three-dimensional (3D) semiconductor device includes providing a horizontal layer structure above a substrate and forming an opening that extends vertically through the horizontal layer structure to the substrate. The method additionally includes lining an inside vertical surface of the opening with a gate stack and lining the inside vertical surface of the opening having the gate stack formed thereon with a sacrificial material layer. The method additionally includes filling the opening with a filling material and removing the sacrificial material layer to form a recess. The method further includes forming the channel by epitaxially growing, in the recess, a channel material upwards from the substrate.

20 Claims, 4 Drawing Sheets

(51) Int. Cl.
  *H01L 29/788* (2006.01)
  *H01L 29/786* (2006.01)
  *H01L 29/792* (2006.01)
  *H01L 21/768* (2006.01)
  *H01L 27/1159* (2017.01)
  *H01L 27/11597* (2017.01)
  *H01L 27/11524* (2017.01)
  *H01L 27/1157* (2017.01)

(52) U.S. Cl.
  CPC ...... *H01L 27/1157* (2013.01); *H01L 27/1159* (2013.01); *H01L 27/11524* (2013.01); *H01L 27/11556* (2013.01); *H01L 27/11597* (2013.01); *H01L 29/7889* (2013.01); *H01L 29/78642* (2013.01); *H01L 29/78696* (2013.01); *H01L 29/7926* (2013.01)

(58) Field of Classification Search
  CPC ........... H01L 27/11597; H01L 29/7889; H01L 29/78642; H01L 29/78696; H01L 29/7926
  See application file for complete search history.

(56) References Cited

U.S. PATENT DOCUMENTS

| | | | | |
|---|---|---|---|---|
| 2014/0284697 | A1* | 9/2014 | Wang | H01L 27/115 257/324 |
| 2014/0353738 | A1* | 12/2014 | Makala | H01L 27/11551 257/321 |
| 2015/0060998 | A1* | 3/2015 | Mizushima | H01L 27/11582 257/330 |
| 2016/0181272 | A1* | 6/2016 | Rabkin | H01L 21/02653 438/268 |
| 2018/0083031 | A1* | 3/2018 | Yamada | H01L 23/53295 |

OTHER PUBLICATIONS

Congedo et al., "Analysis of performance/variability trade-off in Macaroni-type 3-D NAND Memory", In Memory Workshop (IMW), 2014 IEEE 6$^{th}$ International, in 4 pages.

Extended European Search Report dated Jun. 18, 2018 of European Patent Application No. 17210366.5, in 9 pages.

* cited by examiner

THREE-DIMENSIONAL SEMICONDUCTOR DEVICE HAVING VERTICAL CHANNEL EXTENDING THROUGH HORIZONTAL LAYER STRUCTURE AND METHOD OF FABRICATING SAME

CROSS-REFERENCE TO RELATED APPLICATIONS

This application claims foreign priority to European Patent Application No. EP 17210366.5, filed Dec. 22, 2017, the content of which is incorporated by reference herein in its entirety.

BACKGROUND

Field

The disclosed technology generally relates to semiconductor devices, and more particularly to three-dimensional semiconductor devices.

Description of the Related Technology

Increasing consumer demands for electronic products that offer superior performance and/or lower cost in turn demands higher device density in integrated circuit devices. For example, in integrated circuit devices having two-dimensional or planar semiconductor devices, the density of the integrated circuit device can mainly depend on the area occupied by a unit cell of the device, e.g., a memory cell in a memory device. For memory devices, where increasing the device density, or decreasing the cell size, is of particular importance, the challenges of process integration to meet these demands can be particularly difficult due to relatively smaller cell sizes for a given device footprint. To overcome these challenges, three-dimensional (3D) semiconductor devices having three-dimensionally or vertically arranged cells have been recently proposed.

The scaling of vertical 3D semiconductor devices having vertically arranged cells can be achieved by increasing the number of layers of cells, which can lead to longer strings of cells, e.g., in NAND flash memory architecture.

However, longer strings of cells can result in a lower read current through the channel, which can limit the scalability of the 3D semiconductor device. Moreover, improved electrostatic channel control is a requirement for many implementations of a 3D semiconductor device. There is thus a need for improvements within this context.

SUMMARY OF CERTAIN INVENTIVE ASPECTS

An objective of the disclosed technology is to improve 3D semiconductor devices, e.g., 3D memory devices, and manufacturing methods thereof.

According to an aspect of the disclosed technology, a method of manufacturing a three-dimensional (3D) semiconductor device comprising one or more cells, each of which includes a gate structure and a channel, comprises: providing a horizontal layer structure above a substrate; forming an opening that extends vertically through the horizontal layer structure to the substrate; lining an inside surface of the opening with a gate stack; removing a horizontal part of the gate stack such that the opening extends to the substrate; lining the inside surface of the opening with a sacrificial material layer; filling the opening with a filling material, removing parts of the sacrificial material layer to form a recess extending down to the substrate; and forming the channel by epitaxially growing, in the recess, a channel material upwards from the substrate.

As used herein, a layer refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a gate structure refers to a structure including a gate of a semiconductor device, which can include an insulating layer (e.g., a gate dielectric). In the context of a 3D memory device, e.g., a 3D nonvolatile memory device, a gate structure may refer to a control gate.

As used herein, a gate stack may refer to one or more insulating layers, e.g., gate dielectric layers, that separate the gate structure from the semiconductor channel. Further material may be included in the gate stack, as will be disclosed below.

As used herein, epitaxy refers to a growth process in which a crystalline material such as a monocrystalline material is formed by growing, e.g., in an atomic layer-by-layer fashion, on a crystalline substrate such as a monocrystalline substrate. The grown material can be the same or different from the material of the substrate. When the grown material is different and has a different lattice constant as the substrate, the grown material may be pseudomorphic or relaxed. Nevertheless, the grown material can be monocrystalline.

By the above manufacturing process, a hollow cylindrical-shaped or a macaroni-shaped channel may be achieved. This shape can enhance, among other things, the electrostatic channel control (compared to other shapes of the channel such as a channel shaped as a plug), which often important for industrial products such as 3D flash memories currently on the market. To increase the quality of the 3D semiconductor device, materials with better conduction properties are needed for the channel. Examples of such materials include monocrystalline materials such as silicon (Si), germanium (Ge) or III-V compound semiconductors. However, integrating these materials using conventional manufacturing processes to form a macaroni-shaped channel may be difficult. A macaroni-shaped channel can be formed using processes such as chemical vapor deposition (CVD) or atomic layer deposition (ALD). For example, an inside surface of an opening may be lined using these techniques with the channel material to form the macaroni-shaped channel. For certain materials with better conduction properties, epitaxial growth from the silicon substrate and up may be more suitable for forming such a channel. Normally, such growth will fill the entire opening, thus producing a plug-shaped channel. The inventors have realized that, by first lining an inside surface of the opening with a sacrificial material layer (e.g., an amorphous silicon, or SiN, or any other material that is easy to etch selectively), followed by filling the opening with a filling material (e.g., amorphous silicon), followed by removing parts of the sacrificial material layer (leaving the part of the sacrificial layer beneath the filling material), a macaroni shaped recess can be formed, extending around a side surface of the filling material and extending down to the substrate. In this recess, the channel can be formed by epitaxially growing a channel material upwards from the substrate.

According to some embodiments, the step of providing a horizontal layer structure comprises providing alternating layers of a gate material and an insulating material such that the 3D semiconductor device comprises a plurality of cells, wherein each of the gate structures of the plurality of cells comprises a layer of the gate material.

According to some embodiments, the step of providing a horizontal layer structure comprises providing alternating layers of a second sacrificial material and an insulating material. The layers of the second sacrificial material will during the manufacturing process be replaced by gate structure layers. The second sacrificial material may be different from the sacrificial material layer used as a placeholder for the macaroni shaped channel, or it may the same type of material.

With these embodiments, 3D semiconductor devices with more cells are formed. With the manufacturing process described herein, which allows a macaroni shaped channel of materials with better conduction properties to be formed, the disclosed technology may enable 3D semiconductor devices with more layers and therefore more vertically arranged cells, thus improving the density scalability of the cells.

According to some embodiments, the step of removing the sacrificial material layer comprises using an etching procedure to form the recess. Any suitable etching process for etching the sacrificial material may be employed.

According to some embodiments, lining the inside surface of the opening with a sacrificial material layer comprises using a chemical vapor deposition (CVD) process, or atomic layer deposition (ALD).

According to some embodiments, the method further comprises, prior to lining an inside surface of the opening with a sacrificial material layer, extending the opening into the substrate.

Consequently, the filling material will be anchored into the substrate, via the sacrificial layer (and later the channel), improving the stability of the center filling pillar.

According to some embodiments, the step of forming the channel comprises using a crystalline semiconductor material as the channel material.

According to some embodiments, the 3D semiconductor device is a 3D semiconductor memory device, wherein the gate stack comprises a memory material layer, wherein the memory material layer forms the memory element of each of the one or more cells. The memory material layer may be a ferroelectric material layer, charge trapping layer, or a polycrystalline silicon layer, among other layers that may store charge. The insulating layer(s) of the gate stack achieve improved storage of electrons in the memory element of each of the plurality of bit cells.

According to some embodiments, the 3D semiconductor device is a 3D transistor device.

According to a second aspect of the disclosed technology, there is provided a 3D semiconductor device formed by any of the embodiments of the first aspect.

According to a third aspect of the disclosed technology, there is provided a 3D semiconductor memory device formed by suitable embodiments of the first aspect.

According to a fourth aspect of the disclosed technology, there is provided a 3D semiconductor transistor device formed by suitable embodiments of the first aspect.

The second, third and fourth aspect may generally present the same or corresponding advantages as the first aspect.

BRIEF DESCRIPTION OF THE DRAWINGS

The above, as well as additional objects, features and advantages of the disclosed technology, will be better understood through the following illustrative and non-limiting detailed description, with reference to the appended drawings. In the drawings like reference numerals will be used for like elements unless stated otherwise. As illustrated in the figures, the sizes of layers and regions may be exaggerated for illustrative purposes and, thus, are provided to illustrate the general structures of embodiments of the present invention.

DETAILED DESCRIPTION OF CERTAIN ILLUSTRATIVE EMBODIMENTS

In the following, the manufacturing process of 3D semiconductor device will be exemplified by a manufacturing process of a 3D semiconductor device comprising a plurality of cells. Such process will now be described with respect to intermediate structures illustrated in FIGS. 1-6, in conjunction with the method flow chart of FIG. 7. However, it should be noted that the manufacturing process is equally suitable for a 3D semiconductor device comprising only one cell. Moreover, it should be noted that the manufacturing process is equally suitable for a 3D semiconductor transistor device as well as a 3D semiconductor memory device, with one or more cells.

Figure 1:
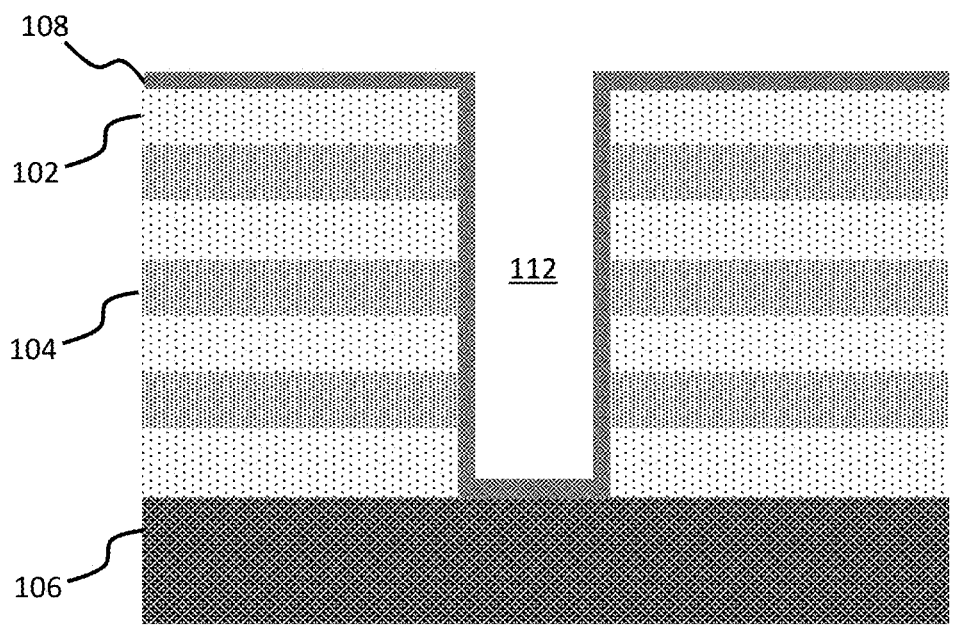
FIGS. 1-6 illustrate cross-sectional views of intermediate structures at different stages of a method of manufacturing a three-dimensional (3D) semiconductor device according to embodiments.

FIG. 1 illustrates a first intermediate structure as part of a method of manufacturing a three-dimensional (3D) semiconductor device comprising a plurality of cells, each of which comprising a gate structure (in the context of a 3D memory, this feature is often called a control gate), a gate stack and a channel. In FIG. 1, a vertical stack of alternating layers of a first layer type 104 and a second layer type 102 is provided S902 (FIG. 7) over a substrate 106. According to some embodiments, the first layer type 104 corresponds to control gate material to form the control gate of each of the plurality of cells of the 3D semiconductor memory device. According to some embodiments, the second layer type 102 corresponds to an insulating layer, e.g., an oxide, for example, silicon oxide.

Further suitable materials of the second layer type 102 may include silicon nitride, silicon oxynitride, organosilicate glass (OSG) and spin-on dielectric materials, to name a few. According to some embodiments, the first layer type 104 may include a sacrificial layer, meaning that the layer type may be removed in the process of manufacturing the 3D memory and replaced with a permanent, e.g., a control gate material. Such replacement process is not further described herein.

Figure 6:
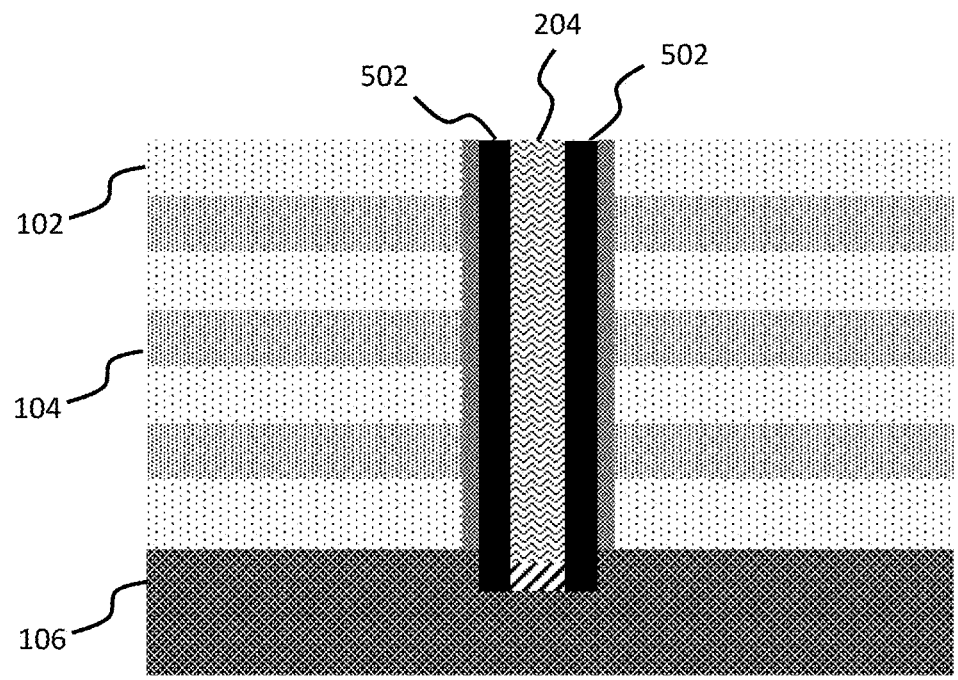
Figure 7:
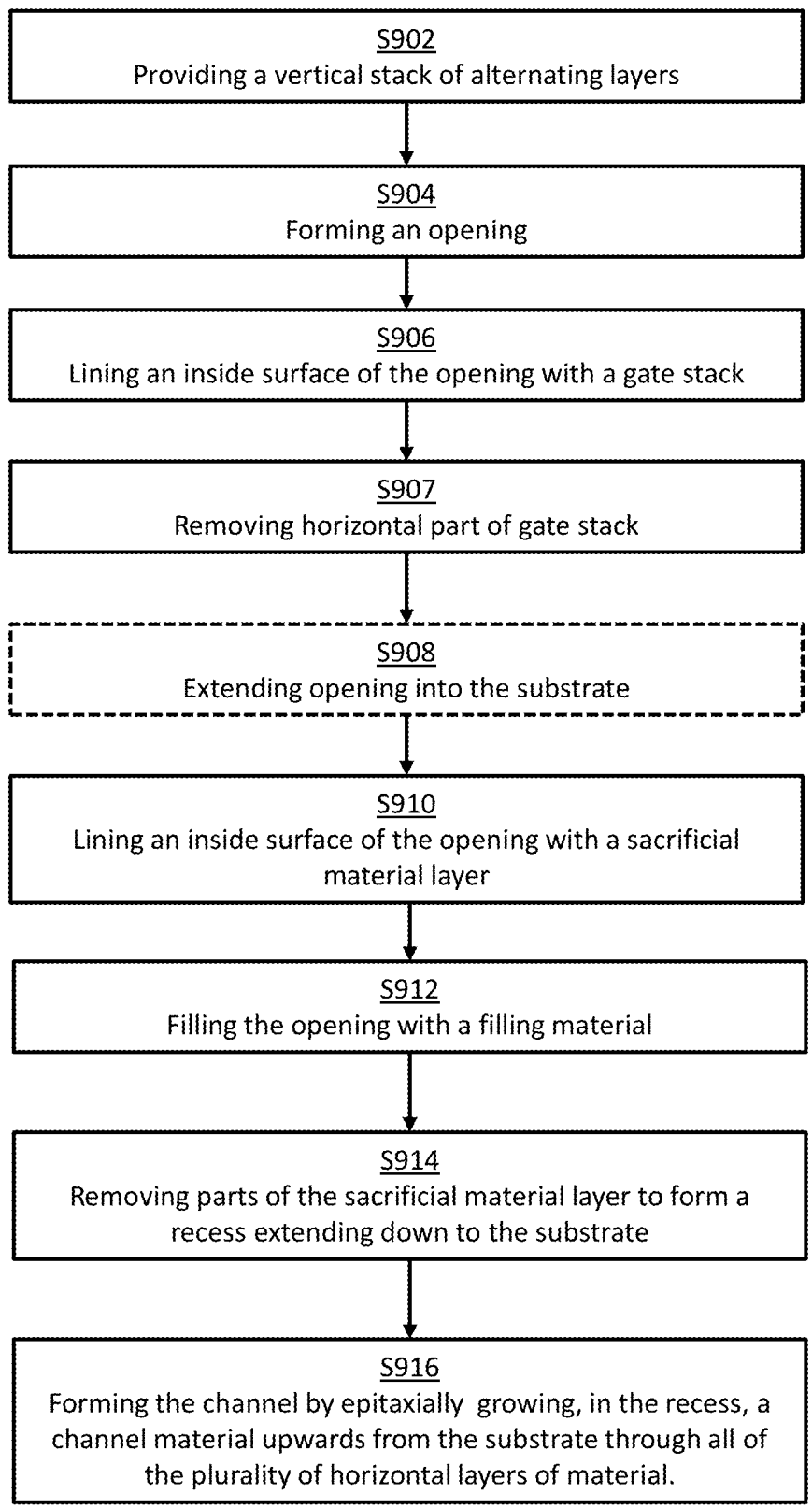
FIG. 7 illustrates a flow chart of a method of manufacturing a 3D semiconductor device according to embodiments.

Through the vertical stack of alternating layers, an opening 112 is formed S904 (FIG. 7). The opening 112 may be provided by etching portions of the stack of alternating layers, 102, 104. In FIGS. 1-6, only one opening 112 is illustrated for clarity. However, it will be appreciated that according to various embodiments, a plurality of such openings may be formed through the vertical stack of alternating layers 102, 104.

Subsequently, an inside surface of the opening is lined S906 (FIG. 7) with a gate stack 108. The gate stack 108 comprises one or more oxides (insulating layers) that separate the gate structure from the later formed semiconductor channel. In some implementations of providing the gate stack 108, the gate stack 108 may be formed also on top of the upper layer in the stack of alternating layers 102, 104.

According to some embodiments, e.g., when a 3D semiconductor memory device is manufactured, a memory material layer, which may be adapted to storing charge, may be included as part of the gate stack 108. Parts of the memory material layer will form a memory element of each of the plurality of cells when the 3D memory is complete. The memory material layer is configured to be programmed such that each of the memory cells can have at least two threshold voltage states. The material of the memory material layer may differ based on the type of 3D memory that is manufactured. For example, in the case a 3D charge-trapping NAND memory device is manufactured, a charge trapping layer (such as a nitride layer sandwiched between two silicon dioxide layers, sometimes referred to as oxide-nitride-oxide or ONO) may be used as the memory material layer 108. In these embodiments, the memory material layer is configured to store charge, e.g., electrons, which can induce the threshold voltage of the memory cell to change. In the case a 3D FeFET memory device is manufactured, a ferroelectric material layer (such as a hafnium dioxide, $HfO_2$, layer) may be used as the memory material layer 108. In these embodiments, a change in threshold voltage of the memory cell can be induced by a change in the polarization state of the ferroelectric material layer. The memory material layer 108 may be formed in the gate stack (on the sidewall of the opening 112) using, e.g., a chemical vapor deposition (CVD) process, or an atomic layer deposition (ALD) process.

In some embodiments, the memory material layer may not be included, e.g., when a 3D semiconductor transistor device is manufactured.

It should be noted that the gate stack can include all dielectric layers that may be needed, depending on the type of device that is manufactured. For example, for a 3D charge trapping NAND, three to six thin layers of dielectric material may be included to achieve the memory functionality.

The memory material layer and insulating layer(s) may in other words be part of the gate stack 108 which is formed (lined) on the sidewall of the opening 112.

Figure 2:
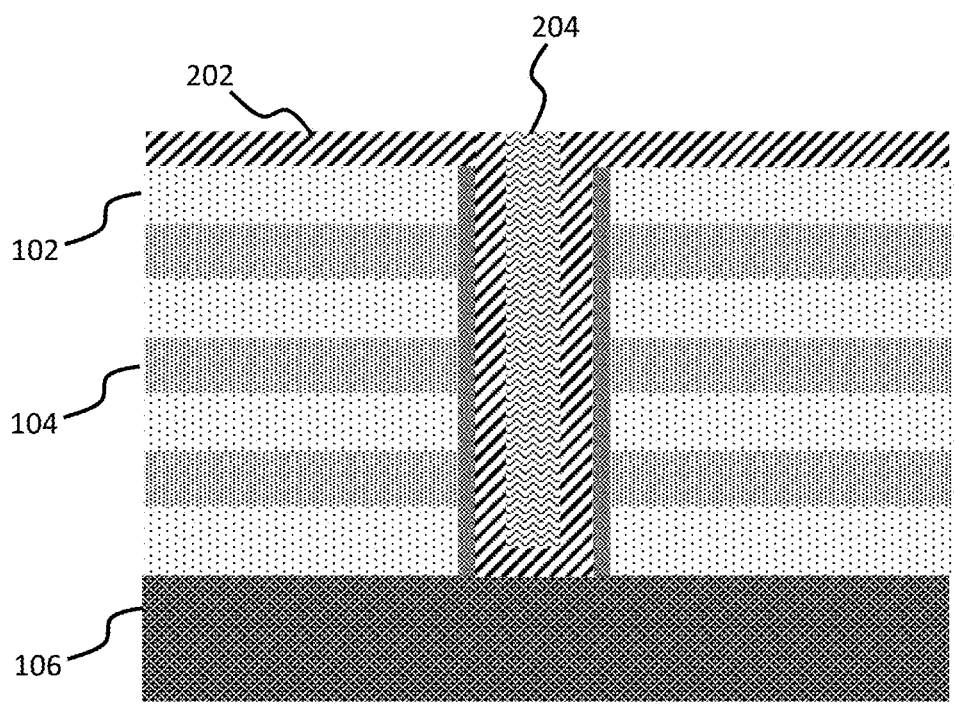

FIG. 2 illustrates a second intermediate structure as part of a method of manufacturing the 3D semiconductor memory device, according to embodiments. In FIG. 2, horizontal portions of the gate stack 108 formed on the stack of alternating layers 102, 104, and on the bottom of the opening are removed S907 (FIG. 7), e.g., through etching, leaving the gate stack 108 on the sidewall of the opening, such that the opening again extends to the substrate. Subsequently, the inside surface of the opening 112 is lined S910 (FIG. 7) with a sacrificial material 202 layer. Examples of suitable sacrificial material include silicon nitride and amorphous silicon. These materials are advantageous in that they may etch selectively against the substrate, or etch at substantially different rates compared to the substrate, thus making it easier to stop the recessing (see below) at the correct moment. The lining may be performed using a CVD/ALD process.

Next, the opening 112 is filled S912 (FIG. 7) with a filling material 204. The filling material 204 may be, e.g., an oxide material.

Figure 3:
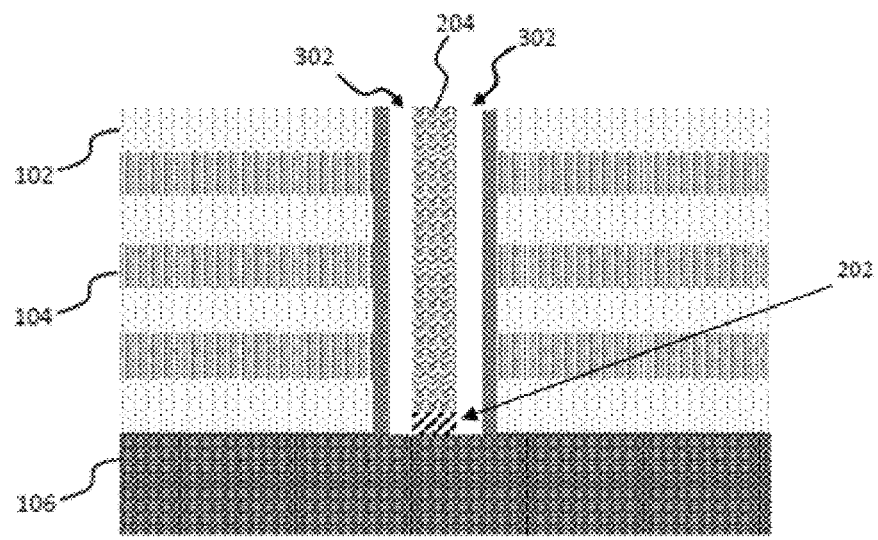

FIG. 3 illustrates a third intermediate structure as part of a method of manufacturing the 3D semiconductor memory device, according to embodiments. In FIG. 3, the sacrificial material layer 202 is partly removed S914 (FIG. 7) to form a recess 302. The recess 302 surrounds a pillar of the filling material 204. The recess 302 extends to the substrate 106. The recessing may be performed using a suitable etching process for etching the material of the sacrificial material layer 202. The etching process should be strongly directional, so as to not remove the sacrificial material 202 under the filler oxide 204.

Figure 4:
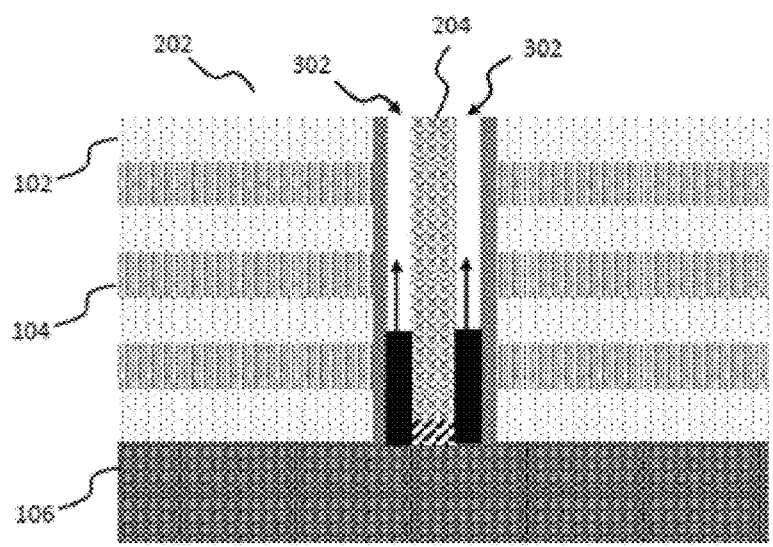
Figure 5:
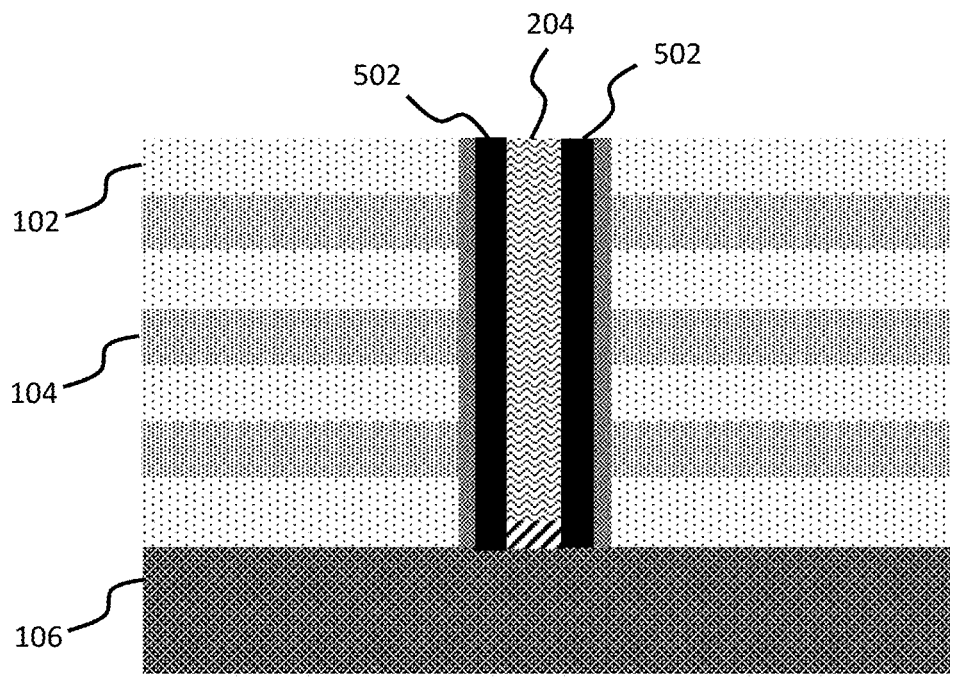

FIGS. 4-5 illustrates fourth and fifth intermediate structures as part of a method of manufacturing the 3D semiconductor memory device, according to embodiments. In FIGS. 4-5, the channel is formed S916 (FIG. 7) by epitaxially growing (illustrated by the arrows in FIG. 4), in the recess 302, a channel material (502 in FIG. 5) upwards from the substrate 106 through all of the plurality of horizontal layers 102, 104 of material (or the single horizontal layer in the case of an one cell embodiment). In FIG. 5, the channel material 502 is grown S916 (FIG. 7) through all of the plurality of horizontal layers 102, 104. The channel material may be any suitable semiconducting material. Preferably, a monocrystalline material such as silicon, germanium or III-V compound semiconductors is formed, e.g., by epitaxial growth, to increase conductivity of the channel. If such material is formed by an ALD/CVD process (a typical process to achieve a pipe shaped geometry for the channel), the resulting channel material 502 may result in a lower quality of the crystal structure of the channel. By using the process described herein, it is possible initiate a proper epitaxial growth that will be confined in a pipe-shaped (macaroni) geometry and will result in a macaroni shaped epitaxial channel. Thus formed Consequently, an improved electrostatic channel control as well as an increased conductivity of the channel may be achieved.

The resulting 3D semiconductor memory device comprises a layer stack comprising gate layers 104 alternating with insulating layers 102 formed over the substrate 106 and an opening formed through the layer stack, where the opening is filled with a pillar structure formed according to the above-described processes. The pillar structure comprises a rod comprising the filling material 204, the channel material 502 surrounding the rod and the gate stack 108 surrounding the channel material 502 and contacting the gate layers 104 and the insulating layers 102.

The structure shown in FIG. 5 is a simplified exemplary design of a 3D semiconductor memory device, for illustrating the disclosed technology of achieving a macaroni shaped channel for a 3D semiconductor device. To further ease the epitaxial regrowth of the channel material, the opening 112 can be extended into the substrate 106. FIG. 6 illustrates by way of example such alternative design.

To achieve the alternative design of the 3D semiconductor device illustrated in FIG. 6, an additional step may be employed. Prior to lining S910 the inside surface of the opening 112 with the sacrificial material layer (shown in FIG. 2), the opening is further extended into the substrate 106, through etching. After this, the procedure is equal to the procedure discussed above.

In the above the disclosed technology has mainly been described with reference to a limited number of examples. However, as is readily appreciated by a person skilled in the art, other examples than the ones disclosed above are equally possible within the scope of the disclosed technology, as defined by the appended claims.

What is claimed is:

1. A method of manufacturing a three-dimensional (3D) semiconductor device comprising one or more cells each comprising a gate structure and a channel, the method comprising:
   providing a horizontal layer structure above a crystalline substrate;
   forming an opening that extends vertically through the horizontal layer structure to the crystalline substrate;
   lining an inside vertical surface of the opening with a gate stack;
   lining the inside vertical surface of the opening having the gate stack lined thereon and a horizontal surface at a bottom of the opening with a sacrificial material layer;
   filling the opening, having the inside vertical and the horizontal surface thereof lined with the sacrificial material layer, with a filling material;
   after filling the opening with the filling material, removing parts of the sacrificial material layer to form a recess positioned laterally between the gate stack and the filling material and extending vertically down from a top of the opening to the crystalline substrate; and
   forming the channel by epitaxially growing, directly on a bottom horizontal surface of the recess comprising an exposed surface of the crystalline substrate, a channel material vertically upwards from the crystalline substrate.

2. The method according to claim 1, wherein lining the inside vertical surface of the opening with the gate stack comprises depositing the gate stack on the inside vertical surface and on a bottom surface of the opening, and after depositing, removing the gate stack formed on the bottom surface of the opening.

3. The method according to claim 1, wherein providing the horizontal layer structure comprises providing alternating layers of a gate material and an insulating material such that the 3D semiconductor device comprises a plurality of cells, wherein the gate structure of each of the cells comprises a layer of the gate material.

4. The method according to claim 1, wherein providing the horizontal layer structure comprises providing alternating layers of a second sacrificial material and an insulating material.

5. The method according to claim 1, further comprising, prior to lining the inside vertical surface of the opening having the gate stack lined thereon with the sacrificial material layer, extending the opening into the crystalline substrate.

6. The method according to claim 1, wherein forming the channel comprises epitaxially growing a crystalline semiconductor material as the channel material.

7. The method according to claim 1, wherein the 3D semiconductor device is a 3D semiconductor memory device, wherein the gate stack comprises a memory material layer, and wherein the memory material layer forms a memory element of each of the one or more cells.

8. The method according to claim 1, wherein the 3D semiconductor device is a 3D transistor device.

9. The method according to claim 1, wherein:
   providing the horizontal layer structure comprises forming a layer stack comprising gate layers alternating with insulating layers over the crystalline substrate; and
   forming the opening comprises forming the opening through the layer stack, wherein the method comprises filling the opening with a pillar structure, wherein the pillar structure comprises:
   a rod comprising the filling material,
   a channel layer surrounding the rod, and
   a gate dielectric surrounding the channel layer and contacting the gate layers and the insulating layers, wherein the channel layer comprises an epitaxial crystal grown on the crystalline substrate.

10. The method according to claim 9, wherein forming the channel layer comprises forming a monocrystalline channel.

11. The method according to claim 9, wherein the channel layer has a hollow cylindrical shape.

12. The method according to claim 9, wherein the opening extends into the crystalline substrate.

13. The method according to claim 9, wherein the filling material is formed of an oxide.

14. The method according to claim 13, wherein after removing the parts of the sacrificial material layer, a sacrificial material layer remains interposed between the filling material and the crystalline substrate.

15. The method according to claim 14, wherein the sacrificial material layer is formed of silicon nitride or amorphous silicon.

16. The method according to claim 9, wherein the 3D semiconductor device is a nonvolatile memory device, and wherein the gate dielectric comprises a charge-trapping layer.

17. The method according to claim 9, wherein the 3D semiconductor device is a nonvolatile memory device, and wherein the gate dielectric comprises a ferroelectric layer.

18. The method according to claim 1, wherein the filling material comprises an oxide, and wherein removing the parts of the sacrificial material layer comprises forming a rod comprising the oxide surrounded by the recess.

19. The method according to claim 18, wherein removing the parts of the sacrificial material layer comprises leaving a portion of the sacrificial material layer vertically between the crystalline substrate and the filling material forming the rod.

20. The method according to claim 19, wherein forming the channel comprises forming a pipe-shaped channel surrounding the rod.